(12) United States Patent
Jaenecke et al.

(10) Patent No.: US 7,336,724 B2
(45) Date of Patent: Feb. 26, 2008

(54) METHOD FOR SCALING PEAK POWER AMPLITUDES IN A SIGNAL AND CORRESPONDING TRANSMITTER

(75) Inventors: Peter Jaenecke, Straubenhardt (DE); Jens Strauss, Althengstett (DE); Luc Dartois, Carrieres sous Poissy (FR)

(73) Assignee: Alcatel, Paris (FR)

( * ) Notice: Subject to any disclaimer, the term of this patent is extended or adjusted under 35 U.S.C. 154(b) by 756 days.

(21) Appl. No.: 10/622,549

(22) Filed: Jul. 21, 2003

(65) Prior Publication Data
US 2004/0042559 A1 Mar. 4, 2004

(30) Foreign Application Priority Data
Aug. 30, 2002 (EP) .................. 02360252

(51) Int. Cl.
*H04K 1/02* (2006.01)
(52) U.S. Cl. ................................... 375/296
(58) Field of Classification Search ........ 375/260–261, 375/295–297, 346; 455/63.1, 501, 114.2, 455/114.3
See application file for complete search history.

(56) References Cited

U.S. PATENT DOCUMENTS

| | | | |
|---|---|---|---|
| 5,727,026 A * | 3/1998 | Beukema | 375/296 |
| 5,835,536 A * | 11/1998 | May et al. | 375/260 |
| 6,240,141 B1 * | 5/2001 | Long | 375/260 |
| 6,314,146 B1 * | 11/2001 | Tellado et al. | 375/346 |
| 6,654,427 B1 * | 11/2003 | Ma et al. | 375/297 |
| 7,095,798 B2 * | 8/2006 | Hunton | 375/296 |

FOREIGN PATENT DOCUMENTS

| | | |
|---|---|---|
| EP | 0940911 A1 | 9/1999 |
| EP | 1195892 A1 | 4/2002 |
| JP | 11-507791 | 7/1999 |

OTHER PUBLICATIONS

M. Maple et al, "Reducing out-of-band emission due to nonlinearities in OFDM systems", Vehicular Technology Conference, 1999, IEEE 49th Houston, Texas, May 16-20, 1999, pp. 2255-2259, XP010342247.

* cited by examiner

*Primary Examiner*—Khanh C. Tran
(74) *Attorney, Agent, or Firm*—Sughrue Mion, PLLC

(57) ABSTRACT

The invention relates notably to a method for scaling peak power amplitudes in a signal at a transmitter before submitting said signal to a power amplifier.

According to the invention, the method consists in:
calculating scaling factors for a pulse train comprising a group of at least two adjacent peaks which power exceed a predefined threshold ($T_{CLIP}$), said scaling factor for one peak taking into account an influence on said peak which occurs if at least one other peak of said group is applied a scaling factor;
applying said calculated scaling factors to said respective peaks of said group.

12 Claims, 3 Drawing Sheets

10-clipping module
11-signal power calculation module
12-peak detector
13-scaling factor calculation module
141-module
142-module

METHOD FOR SCALING PEAK POWER AMPLITUDES IN A SIGNAL AND CORRESPONDING TRANSMITTER

The invention is based on a priority application EP 02 360 252.7 which is hereby incorporated by reference.

FIELD OF THE INVENTION

The present invention relates to a system and method for transmitting digital signals, particularly with techniques to reduce the peak to average ratio (PAR) of signals transmitted in systems using e.g. Orthogonal Code Division Multiplex (OCDM) or Orthogonal Frequency Division Multiplex (OFDM).

BACKGROUND OF THE INVENTION

Usually, the transmit chain of a radio communication network comprises a power amplifier to amplify a signal before transmission over the radio interface. The PAR is an important characteristic of the signal submitted to the power amplifier. The PAR is defined by the ratio between the highest amplitude of the signal and the average amplitude of the signal.

Wideband multi-carrier signals transmitted by one or several users using spread spectrum techniques (e.g. OCDM, OFDM) are presenting a near-Gaussian frequency distribution with a stringent spectrum mask and wide envelope modulation dynamic resulting in high Peak to Average Ratio (PAR about 12 dB).

A power amplifier is usually characterized by its efficiency defined as the ratio between the power of the signal at the amplifier output and the total power consumption of the power amplifier.

A signal having a high Peak to Average Ratio results in a low efficiency of the power amplifier. For a standard compliant amplification of a CDMA signal with a PAR about 12 dB, an over-dimensioning of the amplifier chain of the same order is required (known as power amplifier backoff of about 12 dB). Such an over-dimensioning causes big penalties in terms of required energy supply or appropriate cooling means at the transmitters of the radio communication network (especially at the base stations). This over-dimensioning is nevertheless necessary not to reach the non-linear domain of the power amplifier characteristics. If this happens, peaks in the signal would saturate the power amplifier causing high bit error rate at the receiver because of modulation distortion.

A known countermeasure to this problem is the clipping technique. It consists in eliminating from the signal the peaks having an amplitude above a threshold amplitude determined according to the characteristics of the power amplifier. This is usually obtained by saturating the signal at this amplitude threshold. The choice of the threshold value is a tradeoff between the power amplifier efficiency and the quality of the transmitted signal. Indeed, the lower the threshold is set, the more information contained in the peaks will be removed from the signal and the more the quality is decreased.

The usual clipping techniques have to face non linear filtering problems. On the one hand, saturating the signal at the threshold value generate wide band noise not compatible with requirements set to the signal in term of spectrum mask. Indeed, usual clipping techniques cause the signal spectrum to extend beyond the allowed spectrum mask causing interference in adjacent frequency channels. On the other hand, when filtering is performed to eliminate the noise outside the allowed spectrum mask, the memory effect intrinsic to filtering regenerates signal peaks above the desired threshold value.

Another known method consists in clipping the signal by subtracting a predefined clipping function from the signal when a given power threshold is exceeded. In order to ensure that clipping does not cause any out-of-band interference, a function having approximately the same bandwidth as the signal to clip is selected. This method gives good results as long as no peaks exceeding the threshold fall into the range of the clipping function of another peak.

FIG. 1a shows such a situation where the distance between the peaks exceeding the threshold is large enough not to cause interference between the clipping of different peaks. FIG. 1a illustrates the clipping functions $\delta_{1a}(x), \ldots, \delta_{3a}(x)$ for three peaks Peak1a, ..., Peak 3a respectively separated by a distance $\Delta_{1a}, \ldots, \Delta_{2a}$. The clipping functions $\delta_{1a}(x), \ldots, \delta_{3a}(x)$ are not overlapping since the distance between the peaks is large enough so that the intersection of the clipping function happens in domains where the clipping functions are very attenuated. Each of the clipping functions $\delta_{1a}(x), \ldots, \delta_{3a}(x)$ are multiplied with a scaling factor depending on the peak amplitude and calculated using a usual method.

FIG. 1b, on the contrary, shows a situation where a three peaks exceeding the threshold are concentrated in a small domain causing interference when the signal is clipped. FIG. 1b illustrates the clipping functions $\delta_{1b}(x), \ldots, \delta_{3b}(x)$ for three peaks Peak1b, ..., Peak 3b respectively separated by a distance $\Delta_{1b}, \ldots, \Delta_{2b}$. In this case, the clipping functions $\delta_{1b}(x), \ldots, \delta_{3b}(x)$ are overlapping. The power of the second peak Peak 2b is already decreased when clipping is applied either to Peak 1b or to Peak 3b. As a consequence, the usual scaling factor calculated for Peak 2b depending on its amplitude before any clipping is applied is too high. If such an effect is neglected peak 2b will be overclipped.

A solution to this inconvenient consists in performing several iterations of the clipping method, at each iteration only the highest peaks separated by a large enough distance (not causing overlapping of their clipping functions) are clipped in additional iterations the remaining other peaks are clipped. This method is described in European patent application EP 1 195 892.

An inconvenient of the previous described clipping method is that only a simplified interaction model is used to cope with overclipping causing an increased Peak Code Domain Error and an increased bit error rate.

The object of the present invention is to provide a method for scaling peak power amplitude in a signal that better deals with the reduction of overclipping.

Another object of the present invention is to provide a transmitter implementing this method.

SUMMARY OF THE INVENTION

This object is achieved by a method for scaling peak power amplitudes in a signal at a transmitter before submitting said signal to a power amplifier, said method comprising the steps of:

calculating scaling factors for a pulse train comprising a group of at least two peaks, which power exceed a predefined threshold, said scaling factor,for one peak taking into account an influence on said peak which occurs if at least one other peak of said group is applied a scaling factor;

applying said calculated scaling factors to said respective peaks of said group.

This object is further archieved by a transmitter comprising means for scaling peak power of a signal, said transmitter further comprising a power amplifier for amplifying said signal, wherein said transmitter comprises said means for scaling peak power:

means for calculating scaling factors for a pulse train comprising a group of at least two adjacent peaks which power exceed a predefined threshold, said scaling factor for one peak including the influence on said pulse train which occurs if at least one other peak of the group is applied a scaling factor;

means for applying said calculated scaling factors to said respective peaks of said group.

According to the present invention the method reduces overclipping effects by taking into account the interactive influence of adjacent peaks. The result of this method are near to the theoretical limit.

The method according to the invention has the advantage of keeping the Adjacent Channel Leakage power Ratio (ACLR), as defined in 3GPP TS 25.141 v3.6.0 paragraph 6.5.2.2, in an acceptable range.

Another advantage is to provide an efficient clipping method especially when the power amplifier is used to amplify a multi-carrier signal.

Another advantage is to optimize the frequency spectrum purity for the clipped signal. As a consequence, it increases the system capacity since the ACLR is kept in a acceptable range.

In a preferred embodiment of the invention successive iteration of the scaling method are applied to the signal in order to progressively suppress the signal peaks.

Further advantageous features of the invention are defined in the dependent claims.

BRIEF DESCRIPTION OF THE DRAWINGS

Other characteristics and advantages of the invention will appear on reading the following description of a preferred implementation given by way of non-limiting illustrations, and from the accompanying drawings, in which:

FIG. 1 shows a first signal FIG. 1a where no overdipping effect happens and a second signal FIG. 1b where overclipping effect happens.

DETAILED DESCRIPTION OF THE INVENTION

The following description applies a single carrier signal as well as to a multi-carrier signal.

Figure 2:
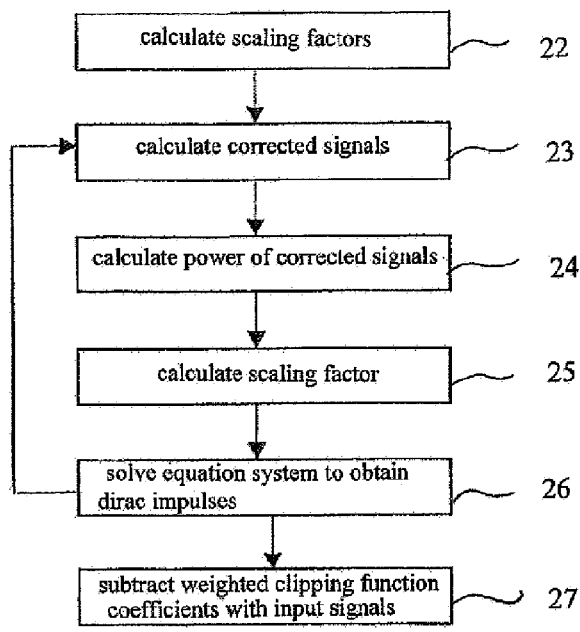
FIG. 2 shows a flow diagram for a possible implementation of the clipping method according to the present invention.

FIG. 2 shows a flow diagram for a possible implementation of the clipping method according to the present invention.

In the following, a signal s(t) to be clipped will be decomposed in its in-phase I(t) and in-quadrature Q(t) components so that s(t)=(I(t),Q(t)).

According to prior art method clipping is performed if the signal Power $P_{max}$ at a peak maximum is higher than a predefined threshold Tclip, fulfilling the following equation: (i being the index referencing the considered peak)

$$P^2_{max}(i)=I^2_{max}(i)+Q^2_{max}(i)>T_{clip}^2 \quad (1)$$

A scaling factor S(i) for the peak referenced with the index i is applied to the components I and Q of the signal s where:

$$S(i)=1-T_{clip}/P_{max}(i) \quad (2)$$

Dirac Impulses $D_I$, resp $D_Q$ with $S(i)*I_{max}(i)$, resp. $S(i)*Q_{max}(i)$ as amplitude and located at the position of the peak maximum $I_{max}(i)$, resp. $Q_{max}(i)$ in each signal component I and Q.

$$D_I(i)=S(i)*I_{max}(i), \quad (3a)$$

$$D_Q(i)=S(i)*Q_{max}(i). \quad (3b)$$

The influence on any sample (I, Q) of the signal resulting from the application of the scaling factor calculated for one single isolated peak referenced with index i is obtained with the following equations:

$$I_c=I-D_I(i)*\delta(\Delta_i)$$

$$Q_c=Q-D_Q(i)*\delta(\Delta_i),$$

where $\Delta_i$ is the distance between sample (I, Q) and the peak ($I_{max}(i)$, $Q_{max}(i)$).

The clipping of the peak ($I_{max}(i)$, $Q_{max}(i)$) itself is obtained when setting $\Delta=0$, $\delta(0)=1$:

$$I_{max}^c(i)=I_{max}(i)-D_I(i)*\delta(\Delta)=I_{max}(i)-I_{max}(i)*S(i) \quad (4a)$$

$$Q_{max}^c(i)=Q_{max}(i)-D_Q(i)*\delta(\Delta)=Q_{max}(i)-Q_{max}(i)*S(i) \quad (4b)$$

The choice of S(i) guarantees that $$[I_{max}^c(i)]^2+[Q_{max}^c(i)]^2=T\text{clip}^2. \quad (5)$$

Now, the influence on any sample (I, Q) of the signal caused by the successive clipping of m peaks is given by:

$$I_c = I - \sum_{j=1}^{m} D_I(i) * \delta(\Delta_i)$$

$$Q_c = Q - \sum_{j=1}^{m} D_Q(i) * \delta(\Delta_i)$$

Where $\Delta_i$ is the distance between sample (I, Q) and peak j.

The influence experienced by one peak ($I_{max}(i)$, $Q_{max}(i)$) resulting from the application of the corresponding scaling factors to all m peaks is obtained as follows:

$$I_{\max}(i)^c = I_{\max}(i) - \sum_{j=1}^{m} D_I(i) * \delta(\Delta_i)$$

$$Q_{\max}^c(i) = Q_{\max}(i) - \sum_{j=1}^{m} D_Q(i) * \delta(\Delta_i)$$

It will be clear for a person skilled in the art that in this case the condition $[I_{max}(i)^c]^2+[Q_{max}^c(i)]^2=T_{clip}^2$ is not fulfilled.

If a first peak $(I(1), Q(1))$ and a second peak $(I(2), Q(2))$ are separated by a distance $\Delta$, the following clipped signals are obtained:

$$I_{max}{}^c(1) = I_{max}(1) - [D_I(1)*\delta(0) + D_I(2)*\delta(\Delta)]$$

$$Q_{max}{}^c(1) = Q_{max}(1) - [D_Q(1)*\delta(0) + D_Q(2)*\delta(\Delta)]$$

$$I_{max}{}^c(2) = I_{max}(2) - [D_I(1)*\delta(\Delta) + D_I(2)*\delta(0)]$$

$$Q_{max}{}^c(2) = Q_{max}(2) - [D_Q(1)*\delta(\Delta) + D_Q(2)*\delta(0)]$$

Using $\delta(0)=1$, setting $s_i(\Delta)=S(i)*\delta(\Delta)$, $s_i(0)=S(i)*\delta(0)=S(i)$ and replacing $D_I(i)=S(i)*I_{max}(i)$, resp $D_Q(i)=S(i)*Q_{max}(i)$ (from equation 3a, 3b), the following equation system is obtained:

$$I_{max}{}^c(1) = I_{max}(1) - [s_1(0)*I_{max}(1) + s_2(\Delta)*I_{max}(2)]$$

$$Q_{max}{}^c(1) = Q_{max}(1) - [s_1(0)*Q_{max}(1) + s_2(\Delta)*Q_{max}(2)]$$

$$I_{max}{}^c(2) = I_{max}(2) - [s_1(\Delta)*I_{max}(1) + s_2(0)*I_{max}(2)]$$

$$Q_{max}{}^c(2) = Q_{max}(2) - [s_1(\Delta)*Q_{max}(1) + s_2(0)*Q_{max}(2)]$$

The terms $s_1(\Delta)$ resp. $s_2(\Delta)$ represent the influence of the second peak on the first peak, resp. the influence of the first peak on the second peak.

According to the present invention, corrected signals $(I_{max}(1)^*, Q_{max}(1)^*)$ resp $(I_{max}(2)^*, Q_{max}(2)^*)$ taking into account the influence of the other signal are calculated the following way:

$$I_{max}(1)^* = I_{max}(1) - D_I(2)*\delta(\Delta)$$

$$Q_{max}(1)^* = Q_{max}(1) - D_Q(2)*\delta(\Delta)$$

$$I_{max}(2)^* = I_{max}(2) - D_I(1)*\delta(\Delta)$$

$$Q_{max}(2)^* = Q_{max}(2) - D_Q(1)*\delta(\Delta)$$

According to the present invention, these corrected signals $(I_{max}(1)^*, Q_{max}(1)^*)$, resp $(I_{max}(2)^*, Q_{max}(2)^*)$ are used for applying the clipping method.

This method is especially advantageous when the peaks are separated by a distance $\Delta$ smaller than a predefined distance. This predefined distance being preferably equal to the convolution range of two peaks (i.e. range of the clipping function).

Figure 1A:
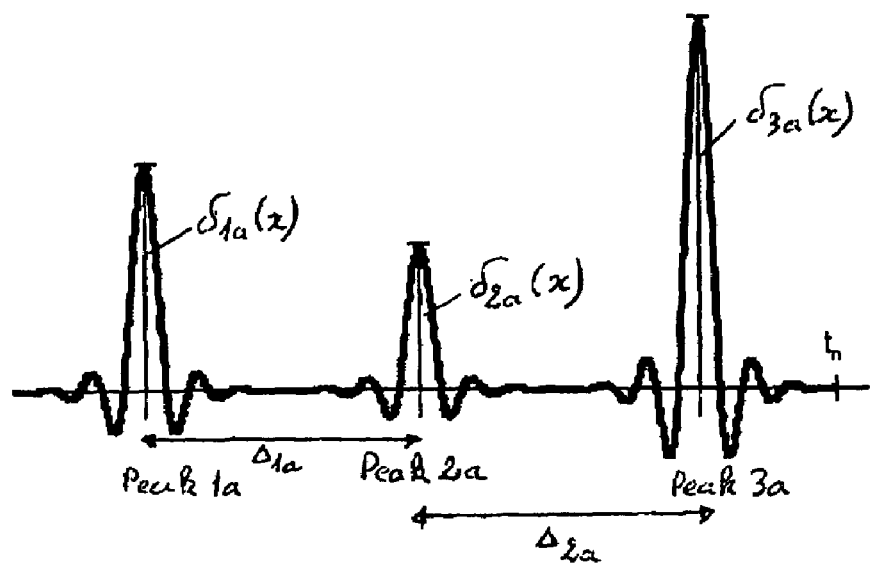
FIGS. 1a and 1b have already been described in relation to prior art.
Figure 1B:
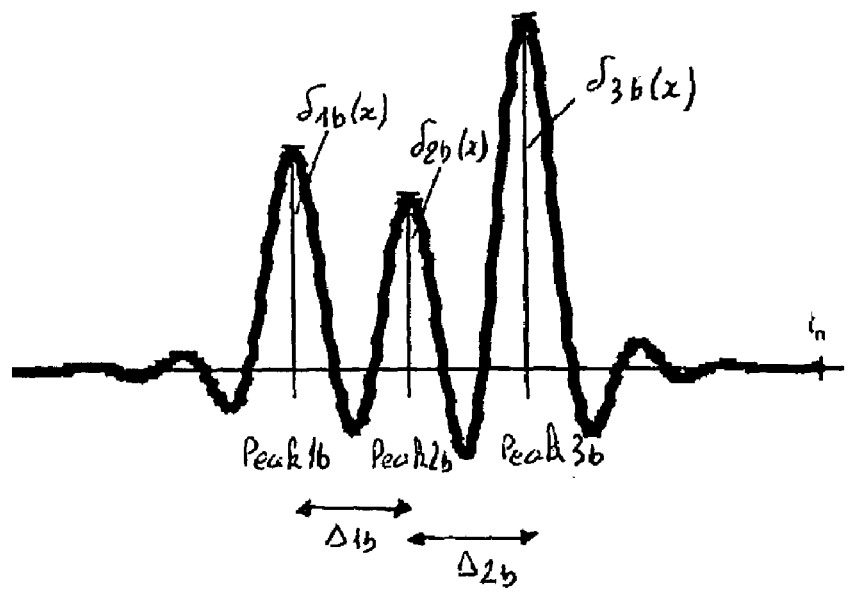

Because the clipping function $\delta(x)$ of a peak drops rapidly with increasing distance from its maximum (see FIG. 1a), the most usual configurations are those where two or three peaks are considered to influence each other. It will however be clear for a person skilled in the art that the method according to the present invention can be generalized to take account of N peaks present in a time domain and influencing each other.

In case of two peaks influencing each other, an implementation of the method according to the present invention preferably comprises following steps:

Step 22 consists in calculating the scaling factors without taking into account the influence of the adjacent peak:

$$S(i) = 1 - T_{clip}/P_{max}(i) \quad \text{(equation 2)}$$

Step 22 consists in determining the Dirac impulses $$D_I(i) = S(i)*I_{max}(i), \quad \text{(equation 3a)}$$

$$D_Q(i) = S(i)*Q_{max}(i), \quad \text{(equation 3b)}$$

Step 23 consists in calculating the corrected signals $(I(i)^*, Q(i)^*)$ for $i=1, 2$.

$$I_{max}(1)^* = I_{max}(1) - D_I(2)*\delta(\Delta)$$

$$Q_{max}(1)^* = Q_{max}(1) - D_Q(2)*\delta(\Delta)$$

$$I_{max}(2)^* = I_{max}(2) - D_I(1)*\delta(\Delta)$$

$$Q_{max}(2)^* = Q_{max}(2) - D_Q(1)*\delta(\Delta)$$

Step 24 consists in calculating the power of the corrected signals $I(i)^*, Q(i)^*$:

$$P(i)^{*2} = I(i)^{*2} + Q(i)^{*2}$$

Step 25 consists in calculating the scaling factor $T(i)$ corresponding to the corrected signals and taking as a consequence into account the influence of the peaks on each other:

$$T(i) = 1 - T\text{clip}/P(i)^*$$

Step 26 consists in solving the following equation system to obtain the dirac impulses $D_I(i), D_Q(i)$.

$$D_I(1) = D_I(2)*\delta(\Delta) + [I_{max}(1) - D_I(2)]T(1)$$

$$D_Q(1) = D_Q(2)*\delta(\Delta) + [Q_{max}(1) - D_Q(2)]T(1)$$

$$D_I(2) = D_I(1)*\delta(\Delta) + [I_{max}(2) - D_I(1)]T(2)$$

$$D_Q(2) = D_Q(1)*\delta(\Delta) + [I_{max}(2) - D_Q(1)]T(2)$$

The obtained Dirac impulses are multiplied with the coefficients of the clipping function $\delta(x)$ to generated weighted clipping function coefficients. Preferably, the clipping function consists in 256 coefficients. However any clipping functions known in the art could be used in the framework of the present invention.

Step 27 consists in subtracting the weighted clipping function coefficients with the input signals $(I(1),Q(1)), (I(2), Q(2))$ (according to the equation system $I_c(i)=I(i)-D_I(i)*\delta(\Delta_i), Q_c(i)=Q(i)-D_Q(i)*\delta(\Delta_i)$).

According to the present invention, this method guaranties that no overclipping occurs and that the clipped signal reaches the predefined threshold $T_{CLIP}$.

In a preferred embodiment of the invention several iterations of the method are repeated to improve the performance of the clipping method according to the present invention.

In this embodiment steps 23 to 26 are repeated until the number of iterations is reached.

Preferably, two or three iterations gives better results.

In a further preferred embodiment of the present invention, a step of hard clipping is applied to the signal clipped with several iterations of the method according to the present invention.

It will be clear for a person skilled in the art that the method according to the present invention can be extended to an approach with N peaks influencing each other. It represents a direct generalization of the previous equations and leads to an equation systems having $D_I(i), D_Q(i)$ for $1<=i<=N$ as parameters and which should be solved according to usual equation systems solving methods which will not be further described.

Figure 3:
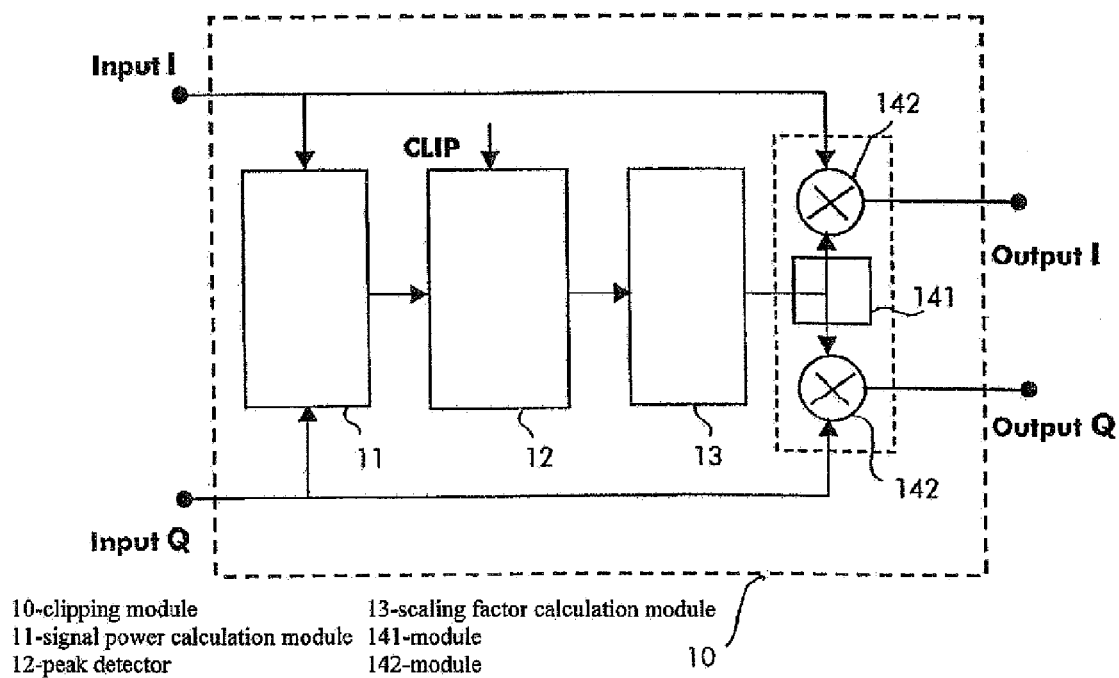
FIG. 3 shows an embodiment of a transmitter according to the present invention.

FIG. 3 shows an embodiment of a transmitter according to the present invention.

The transmitter comprises a clipping module 10 with a signal power calculation module 11, a peak detector 12, and a scaling factor calculation module 13. Clipping module 10 receives as input a baseband signal consisting of an in-phase part, Input I, and an in-quadrature part, Input Q. The base band signal is represented in digital form so that clipping module 10 performs digital processing.

In-phase, Input I, and in-quadrature, Input Q, parts of the signal are connected to signal power calculation module 11 which determines the magnitude of the signal (i.e. by determining the module of the vector having the in-phase value as real part and the in-quadrature value as complex part in the complex space).

The signal power is submitted to peak detector 12 which compares the amplitude of the signal magnitude with a predefined threshold value $T_{CLIP}$. Peak detector 12 determine the different peak amplitudes Pmax, the corresponding I and Q coordinates Imax, Qmax and the peak positions Tmax.

Peak detector 12 selects the peak which amplitude is higher than the threshold $T_{CLIP}$, that should be taken into account for further processing. A further selection criterion is the number N of peaks to be kept for further processing in a time window of predefined duration. An other selection criterion is the distance between two consecutive peaks. This distance being preferably smaller than a predefined distance (e.g. the convolution range of the clipping function (impulse answer). Other peak selection criteria may be envisaged.

Information on the selected peak amplitude Imax, Qmax, Pmax, Tmax is submitted to scaling factor calculation module 13 which calculates a scaling factor to be applied to each peaks taking into account the influence $DI_{previous}$, $DQ_{previous}$ and $Tmax_{previous}$ of the other peaks located in the convolution range of the peak. In the case N peaks have influence on each other, the influence of all N peaks is taken into account in the scaling factor calculation.

Scaling factor calculation module 13 further calculates the Dirac functions according to step 26 of FIG. 2 to obtain $D_I$ and $D_Q$.

The clipping functions coefficients are weighted with the calculated dirac functions $D_I$ and $D_Q$ and subtracted from the signal Input I and Input Q as usually performed in the art ($I_c=I-D_I(i)*\delta(\Delta_i)$, $Q_c=Q-D_Q(i)*\delta(\Delta_i)$). It is to be noted that the input signal should be delayed by the appropriate time delay as known by a person skilled in the art.

The calculated dirac functions $D_I$ and $D_Q$ are stored in scaling factor calculation module 13 to be used as $DI_{previous}$, $DQ_{previous}$ when calculating the dirac functions for next peak.

The output of the scaling factor calculation module 13 is passed to module 141. in module 142, outputs of module 141 are processed together with input I and input Q to give output I and output Q, respectively.

Contrary to usual known clipping methods consisting in saturating the peaks at the threshold value, the method according to the invention consists in applying scaling factors to the peaks which have an amplitude above a predefined threshold $T_{CLIP}$ which takes as exactly as possible into account the influence of other peaks located in the convolution range of the peak not to generate overclipping effects. The method according to the invention the spectrum of the input signal experiences less distortions than with usual clipping methods.

Figure 4:
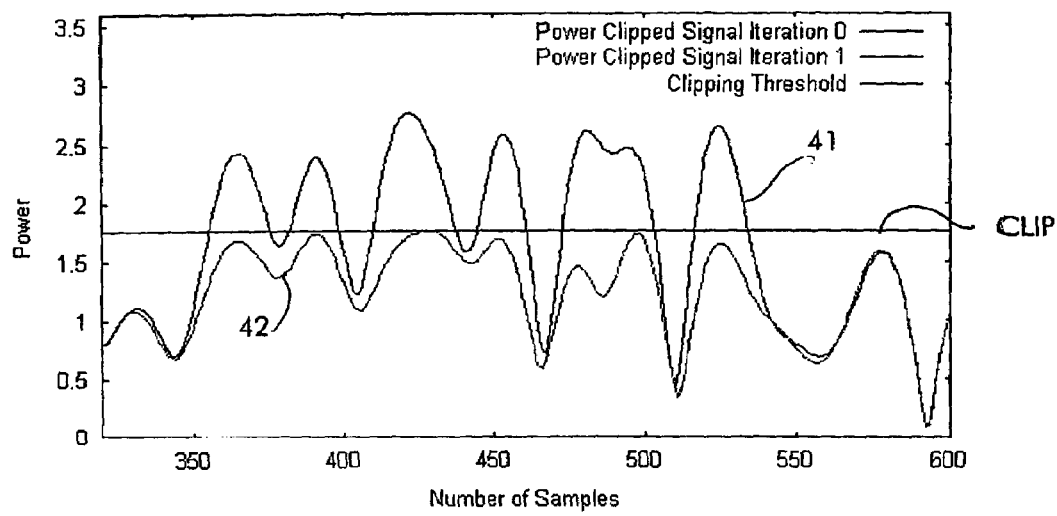
FIG. 4 shows results of the clipping method according to the present invention applied on a signal.

FIG. 4 shows the results of the clipping method according to the present invention. x-coordinate of the diagram represents the time or more precisely the sample number of the signal in the time window, y-coordinate of the diagram represents the amplitude of the signal magnitude.

This example has been done using a single carrier signal, it will however be clear for a person skilled in the art that identical results can be obtained for a multi-carrier signal.

The section of the signal 41 shown on FIG. 4 normally causes problems for methods ignoring the mutual influences of adjacent peaks having an amplitude higher than a predefined threshold $T_{CLIP}$. The curve 42 shows the clipped signal obtained using the method according to the present invention after one iteration and using the two peaks approach.

Figure 5:
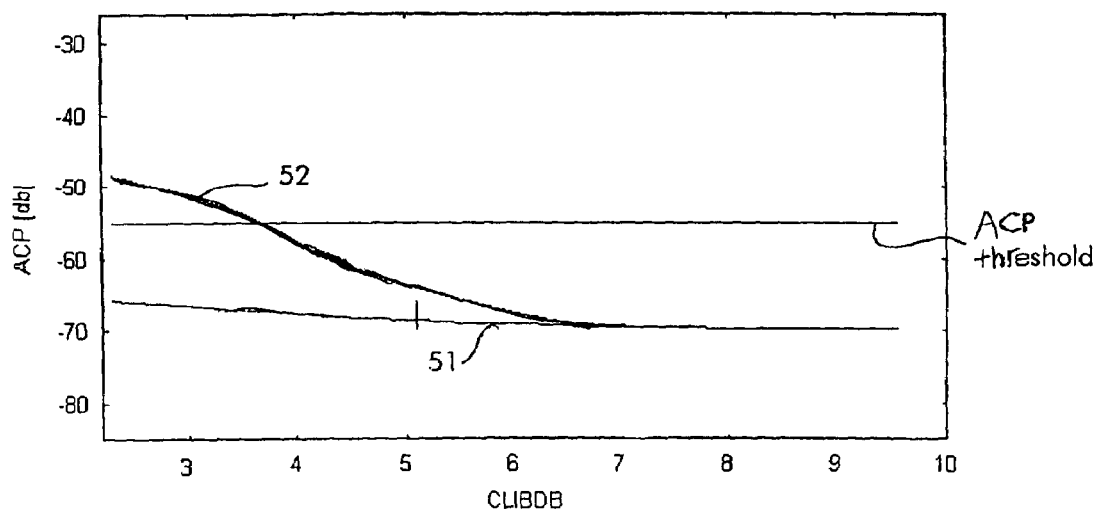
FIG. 5 shows the ACLR obtained when using different clipping method.

FIG. 5 illustrate an example where the ACLR obtained when using different clipping methods are compared. x-coordinate of the diagram represents PAR of the clipped signal, y-coordinate of the diagram represents ACLR in dB.

Curve 51 shows the ACLR obtained when applying the clipping method according to the present invention after 3 iterations.

Curve 52 shows the ACLR obtained when applying three iterations of a prior art clipping method which does not take into account the mutual interaction on close peaks.

For PAR higher than about 4 dB, the ACLR increases significantly for curve 52. On the contrary using the method according to the present invention the ACLR increases slightly in the same domain and remains lower than the value ACLR threshold guarantying good performance in term of Peak Code Domain Error and Bit Error Rate in the telecommunication network.

The result of the clipping method according to the present invention leaves almost unchanged the ACLR up to a Peak to Average Ratio equal to about 4 dB.

The invention claimed is:

1. Method for scaling peak power amplitudes in a signal at a transmitter before submitting said signal to a power amplifier, said method comprising:
   calculating scaling factors for a pulse train comprising a group of at least two peaks whose power exceeds a predefined threshold, said scaling factor for one peak taking into account an influence on said peak which occurs if at least one other peak of said group is applied a scaling factor; and
   applying said calculated scaling factors to said respective peaks of said group.

2. Method according to claim 1, wherein said influence depends on the distance between said peak and said at least one other peak.

3. Method according to claim 1, wherein said calculation of said scaling factors comprises:
   calculating corrected signals for each peak taking into account said influence of other peaks of said group;
   Calculating for each peak a scaling factor corresponding to said corrected signal.

4. Method according to claim 1, wherein said scaling factors for said train of pulses guaranty that the power of the scaled peaks belonging to said group reaches said predefined threshold.

5. Method according to claim 1, wherein said scaling factors for said train of pulses guaranty that an average power of the clipped signal is higher than said predefined threshold value.

6. Method according to claim 1, wherein at least two iterations of said method are successively applied to said signal followed by a step of hard clipping.

7. Method according to claim 1, wherein said signal is a signal comprising a plurality of single carrier signals constituted by a superposition of several CDMA signals.

8. The method according to claim 1, wherein said influence includes results of calculated Dirac functions.

9. Transmitter comprising:
means for scaling peak power of a signal, and
a power amplifier for amplifying said signal,
wherein said means for scaling peak power comprises:
means for calculating scaling factors for a pulse train comprising a group of at least two adjacent peaks whose power exceeds a predefined threshold, said scaling factor for one peak including an influence on said pulse train which occurs if at least one other peak of the group is applied a scaling factor; and
means for applying said calculated scaling factors to said respective peaks of said group.

10. Transmitter according to claim 9, wherein said means for scaling peak power is implemented on a DSP or a FPGA.

11. Transmitter according to claim 9, wherein said transmitter is used in a base station of a CDMA radio communication network.

12. Transmitter according to claim 9, wherein said scaling factors for said train of pulses guaranty that an average power of the clipped signal is higher than said predefined threshold value.

* * * * *